United States Patent [19]

Lobenhofer, deceased et al.

[11] 3,818,350

[45] June 18, 1974

[54] TUNING ARRANGEMENT

[75] Inventors: Gerhard Lobenhofer, deceased, late of Amberg, Germany; by Anna Lobenhofer; by Annemarie Mauracher, both of Amberg, Germany heiresses; Dieter Beifuss, Nuremberg, Germany

[73] Assignee: Licentia Patent-Verwaltungs-G.m.b.H., Frankfurt am Main, Germany

[22] Filed: Mar. 11, 1970

[21] Appl. No.: 123,162

[30] Foreign Application Priority Data

Mar. 13, 1970 Germany ........................... 2011893

[52] U.S. Cl. .................. 325/445, 325/452, 325/489

[51] Int. Cl. ............................................. H04b 1/26

[58] Field of Search ........... 325/374, 379, 383, 385, 325/386, 430, 442, 445, 452, 473, 477, 489, 490, 25; 333/73 W, 77, 82 R, 83 R; 334/61, 63, 85

[56] References Cited

UNITED STATES PATENTS

| | | | |
|---|---|---|---|
| 2,270,017 | 1/1942 | Brailsford | 325/452 |
| 2,370,758 | 3/1945 | Thompson | 325/445 |
| 2,427,107 | 9/1947 | Landon | 325/445 |
| 2,654,836 | 10/1953 | Beck et al. | 325/446 |
| 2,762,987 | 9/1956 | Mackey | 334/61 |
| 3,217,096 | 11/1965 | Caprio et al. | 325/489 |
| 3,533,020 | 10/1970 | Hecht | 333/77 |

*Primary Examiner*—Albert J. Mayer
*Attorney, Agent, or Firm*—Spencer & Kaye

[57] ABSTRACT

A tuning device comprising a band-pass filter, oscillator circuits in the form of λ/2 resonant-line circuits, particularly in the form of a printed circuit applied to a metal-clad board of insulating material, and a tunable input circuit in the form of a λ/4 resonant-line circuit.

4 Claims, 7 Drawing Figures

Inventors.
Gerhard Lobenhofer
Dieter Beifuss

BY Spencer & Kaye
ATTORNEYS.

TUNING ARRANGEMENT

BACKGROUND OF THE INVENTION

The present invention relates to a tuning device with band-filter and oscillator circuits, which are provided by the λ/2 technique in the form of resonant-line circuits, particularly in the form of a printed circuit on a metal-clad board of insulating material, and wherein a tunable input circuit is provided in addition.

In such known devices for the UHF bands IV and V frequency range, the input circuit is constructed by the same technique as the other circuits. That is to say, all circuits are constructed either by the λ/2 or by the λ/4 technique.

SUMMARY OF THE INVENTION

It is the object of the present invention to solve the problem of equipping a tuning device in the λ/2 technique with a tunable input circuit so that as high a stability as possible is achieved with respect to cross modulation with the minimum possible inherent noise in the receiving unit.

According to the invention, this is achieved in that the input circuit is constructed in the form of a λ/4 resonant-line circuit.

As a result of this solution, a minimum noise is achieved because the frequency response of the quality of a λ/4 circuit for use as an input circuit is more favourable than that of a λ/2 circuit. Additional losses in the dielectric carrier material of the partially printed λ/2 circuit are eliminated in the λ/4 circuit, as a result of which this has less self-damping.

With suitable dimensioning, the λ/4 input circuit can be tuned so that it is in synchronism with the other λ/2 circuits. So as not to alter substantially the coupling relationship for optimum noise matching, which has once been set or is known, of the input circuit, for example with the preselector-stage transistors, according to an advantageous further development of the invention, it is proposed to make the inductance of the resonant circuit of the input circuit or a portion thereof bifilar so that the bifilar partial inductances are variable in their mutual spacing and the reversal point forms the coupling point for the input-stage transistors. Although such an arrangement of the inductance of the resonant circuit is particularly suitable for the present tuning device according to the invention, this may also be used to advantage for other resonant-line circuits or resonant circuits of a conventional form of construction. It is therefore not restricted to a λ/4 resonant-line circuit, and particularly not to an input circuit.

BRIEF DESCRIPTION OF THE DRAWINGS

The invention will now be further described, by way of example, with reference to the accompanying drawings, in which.

DESCRIPTION OF THE PREFERRED EMBODIMENT

Figure 1:
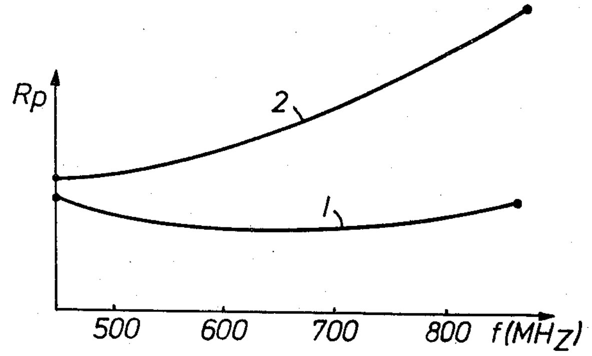
FIG. 1 represents a diagram Rp = *f*(*f*) for a λ/4 and a λ/2 resonant-line circuit.
Figure 2A:
FIG. 2*a* shows, diagrammatically, a λ/2 resonant-line circuit with lumped parameters.
Figure 2B:
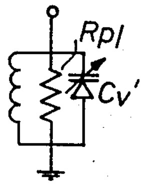
FIG. 2*b* shows the equivalent parallel circuit diagram of the circuit illustrated in FIG. 2*a;*
Figure 3A:
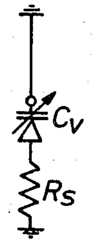
FIG. 3*a* shows, diagrammatically, a λ/4 resonant-line circuit with lumped parameters.
Figure 3B:
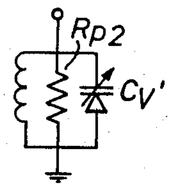
FIG. 3*b* shows the equivalent parallel resonant circuit diagram of the circuit illustrated in FIG. 3*a;*

In FIG. 1, the curve Rp = *f*(*f*), where Rp is the equivalent parallel resistance of the resonant line circuit, for a capacitively variable-frequency λ/2 resonant-line circuit in the frequency range 470 – 790 Mcps is represented at 1. Initial and final value amount to about 2 kΩ with the dimensioning given in FIG. 2*a*. The curve designated by 2 shows the same conditions for a λ/4 resonant-line circuit which is constructed in accordance with FIG. 3*a*. The initial value Rp of the curve is already of the order of magnitude of that of the λ/2 resonant-line circuit, whereas it rises towards the maximum tuning frequency up to about 10 kΩ.

Figure 4:
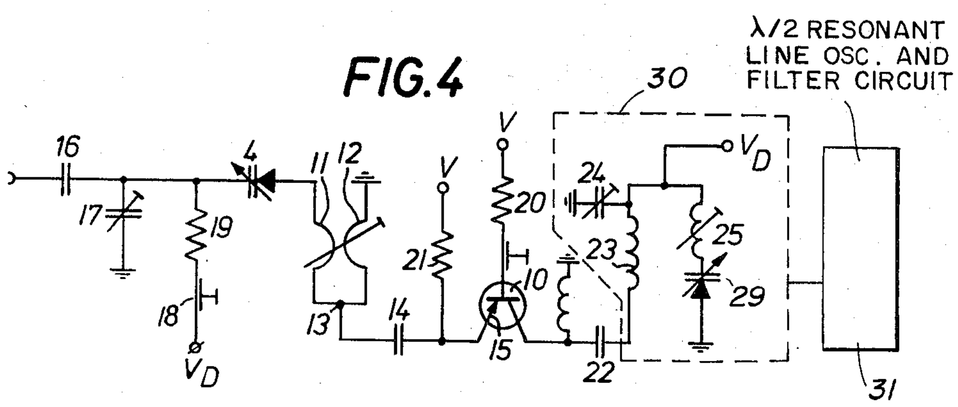
FIG. 4 is a circuit diagram of one arrangement of an input circuit according to the invention.

In the circuit diagram of a preferred embodiment illustrated in FIG. 4, to the left of a preselector-stage transistor 10 there is the input circuit which is constructed in the form of a λ/4 resonant-line circuit and which consists of a tuning diode 4 and a line inductance consisting of two partial inductances 11, 12 extending in bifilar relationship to one another. The partial inductances 11, 12 form all or a portion of the resonant-circuit inductance. Their turning point 13 is connected to the input electrode 15 of the amplifier or preselector-stage transistor 10 through a coupling capacitor 14. Consequently, as a result of the arrangement of the partial inductances and the connection point 13 currents flow in opposite directions in the inductances 11 and 12. The values of the partial inductances 11, 12 are selected so that there is the most favourable noise matching of the input circuit to the amplifier or preselector-stage transistor 10 at the turning point.

According to the invention the mutual indictance of the partial inductance 11, 12 is adjustable, as a result of which the line inductance is variable. In the simplest case, this is effected by the fact that the partial inductances are constructed in the form of deformable conductor portions so that their mutual spacing can be varied in a simple manner by bending. It is also possible, however, to vary the mutual inductance of the partial inductances 11, 12 by advancing or screwing in a small metal plate, in particular of ferromagnetic material, so that this covers the two partial inductances 11, 12 to a greater or lesser extent for example. The last possibility is particularly advantageous if the partial inductances 11, 12 are also to be constructed in the form of portions of printed circuits.

The input signal passes through a coupling capacitor 16 to the tuning diode 4. Between these, a trimmer capacitor 17 is connected to earth. At the same time, the d.c. tuning voltage $V_D$ is injected here through a decoupling capacitor 18 and a resistor 19.

The preselector-stage transistor 10 receives its operating voltage V through resistors 20, 21. To the right of the preselector-stage transistor 10 there is shown a first HF band-pass filter circuit 30 which, like the other resonant circuits not specifically illustrated but indicated generally by the Box 31, is constructed in the form of a λ/2 resonant-line circuit with divided characteristic impedance. It is coupled to the output of the preselector stage transistor 10 through a capacitor 22 and consists essentially of a printed inductance portion 23 with low characteristic impedance, the node trimmer capacitor 24 which is connected to earth, a trimming inductance 25 and a tuning diode 29 which is connected to earth. The tuning voltage $V_D$ for the resonant line circuit 23, 24, 25, 29, is injected at the junction of the inductances 23 and 25. In a manner well known in the art, the remaining resonant circuits of the tuning device may be capacitively, inductively or galvanically coupled to the band pass filter circuit 23, 24, 25, 29.

Figure 5:
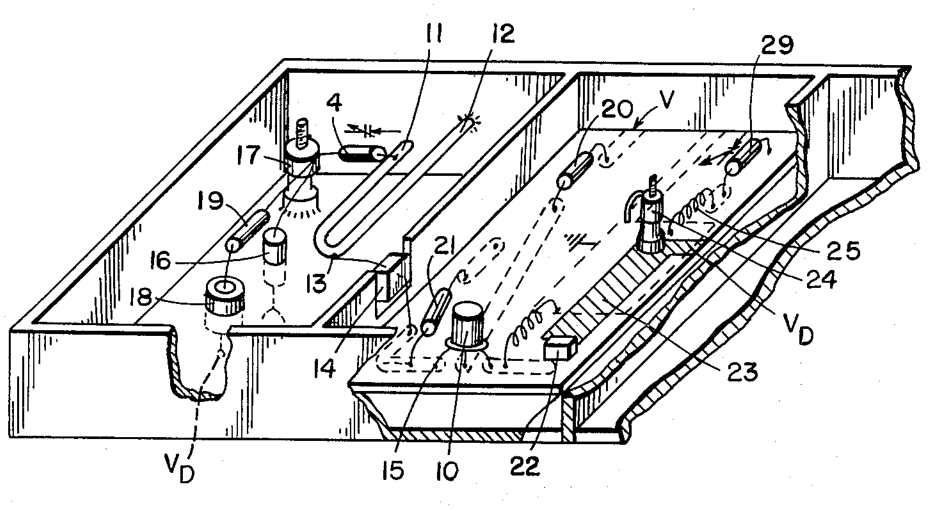
FIG. 5 is a perspective view of a physical realization of the circuit of FIG. 4 showing the λ/4 and λ/2 resonant line circuits with the λ/2 resonant line circuit having a portion thereof in the form of a printed circuit.

FIG. 5 shows a physical realization of the λ/2 resonant line circuit 23, 24, 25, 29 wherein the inductance portion 23 is formed as a printed circuit. That is, as shown in this figure the inductance portion 23 of the λ/2 resonant line circuit is formed by printed circuit techniques by the metal layer on one surface of a board of insulating material 30 whose opposite surface may, as is conventional, be provided with a further metal layer which, by printed circuit techniques, can serve as a ground plane or to make connections between components as, for example, between inductance 25 and tuning diode 29.

FIG. 5 also shows the λ/4 resonant input circuit with the partial inductances 11 and 12 being formed by a single deformable conduction so that the mutual spacing between the two portions, and hence the mutual inductance, can be varied.

The tracking of the resonant-line circuits is adjusted at the lower end of the frequency range, that is to say, in the television range IV at about 470 Mcps, by the trimmer capacitors 17 and 24 respectively. At the upper end of the range (for example 790 Mcps) the adjustment is effected by means of the adjustable inductance of the partial inductances 11 and 12 of the λ/4 resonant-line circuit and the trimming inductance 25 of the λ/2 resonant-line circuit.

As can easily be seen with reference to FIG. 4, the coupling to the preselector-stage transistor 10 is little altered, even on a variation in the line inductance formed from the partial inductances 11, 12, or a portion thereof, because the ratio of the partial inductances 11, 12 and hence the division ratio is substantially retained.

It will be understood that the above description of the present invention is susceptible to various modifications, changes and adaptations.

What is claimed is:

1. In a tuning device having a tunable input circuit, an amplifier stage having its input electrode connected to the output of said input circuit, and λ/2 resonant line band-pass filter and oscillator circuits which are coupled to and tune the output of said amplifier stage, the improvement wherein said tunable input circuit is a λ/4 resonant-line circuit.

2. A tuning device as claimed in claim 1, including a metal-clad board of insulating material, and wherein the conductors of said λ/2 resonant line circuits are provided at least in part, in the form of printed circuits formed by the metal cladding of said board.

3. A tuning device as claimed in claim 1, in which said tunable input circuit includes an inductance which constitutes at least a portion of the line inductance of said resonant line circuit, one end of said inductance being connected in series with a signal input terminal for said tunable input circuit and the other end being connected to ground, said inductance being divided into two partial inductances with said partial inductances being arranged adjacent one another in such a manner that currents flow in opposite directions in adjacent portions, the mutual inductance of said partial inductances being adjustable and said input electrode of said amplifier stage being connected to said inductance in the region between said partial inductances.

4. In a tuning device having a tunable input circuit, an amplifier stage connected to the output of said input circuit and resonant line band-pass filter and oscillator circuits which are coupled to and tune the output of said amplifier stage with at least the oscillator circuit being a λ/2 resonant line circuit, the improvement wherein said tunable input circuit is a λ/4 resonant line circuit.

* * * * *

UNITED STATES PATENT OFFICE
CERTIFICATE OF CORRECTION

Patent No. 3,818,350 Dated June 18th, 1974

Inventor(s) Gerhard Lobenhofer et al

It is certified that error appears in the above-identified patent and that said Letters Patent are hereby corrected as shown below:

In the heading of the patent, line 11, change "1970" to --1971--;

Column 1, line 11, after "known" insert --tuning--;
line 62, after "parallel" insert --resonant--;
Column 2, line 18, after "curve" insert --2--.

Signed and sealed this 22nd day of October 1974.

(SEAL)
Attest:

McCOY M. GIBSON JR.
Attesting Officer

C. MARSHALL DANN
Commissioner of Patents

FORM PO-1050 (10-69)
USCOMM-DC 60376-P69
☆ U.S. GOVERNMENT PRINTING OFFICE : 1969 O—366-334.